(12) United States Patent
Kim et al.

(10) Patent No.: US 9,531,484 B2
(45) Date of Patent: Dec. 27, 2016

(54) SUPER-REGENERATIVE RECEIVER (SRR) AND SUPER-REGENERATIVE RECEPTION METHOD WITH INCREASED CHANNEL SELECTIVITY

(71) Applicant: Samsung Electronics Co., Ltd., Suwon-si (KR)

(72) Inventors: Seong Joong Kim, Hwaseong-si (KR); Yong Kyu Kim, Hwaseong-si (KR); Seok Ju Yun, Hwaseong-si (KR); Young Jun Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 14/490,896

(22) Filed: Sep. 19, 2014

(65) Prior Publication Data

US 2015/0207530 A1    Jul. 23, 2015

(30) Foreign Application Priority Data

Jan. 21, 2014   (KR) .................. 10-2014-0007058

(51) Int. Cl.
| | | |
|---|---|---|
| *H04B 17/21* | (2015.01) | |
| *H04B 1/12* | (2006.01) | |
| *H03F 3/45* | (2006.01) | |

(52) U.S. Cl.
CPC .......... *H04B 17/21* (2015.01); *H03F 3/45188* (2013.01); *H04B 1/123* (2013.01); *H03F 2200/294* (2013.01)

(58) Field of Classification Search
CPC .................. H03F 2200/294; H04L 27/063

USPC ...... 455/336, 114.2, 307, 259, 260; 375/219
See application file for complete search history.

(56) References Cited

U.S. PATENT DOCUMENTS

| | | | | |
|---|---|---|---|---|
| 5,742,902 | A * | 4/1998 | Shore ................. | G07C 9/00182 340/12.5 |
| 2002/0168957 | A1 | 11/2002 | Mapes | |
| 2004/0198288 | A1* | 10/2004 | Sadowski ............. | H03D 11/02 455/259 |
| 2004/0219900 | A1 | 11/2004 | Zheng et al. | |
| 2005/0069051 | A1 | 3/2005 | Lourens | |
| 2011/0235690 | A1* | 9/2011 | Jantunen ............ | H04B 1/71637 375/219 |

(Continued)

FOREIGN PATENT DOCUMENTS

| | | | | |
|---|---|---|---|---|
| EP | 519145 | A1 * | 12/1991 | ............. H03D 11/04 |
| JP | 4545932 | B2 | 9/2010 | |

(Continued)

OTHER PUBLICATIONS

Chen, Jia-Yi, et al. "A 3.6 Mw 2.4-Ghz Multi-Channel Super-Regenerative Receiver in 130nm CMOS." Custom Integrated Circuits Conference (2005). Proceedings of the IEEE 2005: 361-364.

(Continued)

*Primary Examiner* — Edward Urban
*Assistant Examiner* — Max Mathew
(74) *Attorney, Agent, or Firm* — NSIP Law

(57) ABSTRACT

A super-regenerative receiver (SRR) includes a super-regenerative oscillator (SRO), and an active channel filter disposed at a front end of the SRO, and configured to filter out an interferer in a signal received by the SRR.

18 Claims, 15 Drawing Sheets

(56) References Cited

U.S. PATENT DOCUMENTS

| | | | | |
|---|---|---|---|---|
| 2012/0322395 A1* | 12/2012 | McCullagh | .......... | H04B 1/1036 455/114.2 |
| 2013/0107988 A1* | 5/2013 | Park | ........................ | H04B 1/30 375/316 |
| 2015/0010120 A1 | 1/2015 | Yun et al. | | |

FOREIGN PATENT DOCUMENTS

| | | | | | |
|---|---|---|---|---|---|
| KR | GB 2433365 A | * | 6/2007 | ............. | H03D 11/06 |
| KR | 10-2015-0004977 A | | 1/2015 | | |

OTHER PUBLICATIONS

Li, Shengyuan. "RF On-Chip Filters Using Q-Enhanced LC Filters." 2005 (123 pages, in English).

Zhiqiang, Gao. "Design of CMOS Integrated Q-enhanced RF Filters for Multi-Band/Mode Wireless Applications." *Advanced Trends in Wireless Communications*, 2011 (33 pages, in English).

Fernandez-Rodriguez, Félix O., et al. "Advanced Quenching Techniques for Super-Regenerative Radio Receivers." *Circuits and Systems I: Regular Papers, IEEE Transactions on* 59.7 (2012): 1533-1545.

Nadeau, Phillip M., et al. "Multi-channel 180pJ/b 2.4 GHz FBAR-based receiver." Radio Frequency Integrated Circuits Symposium (RFIC), IEEE (2012): 381-384.

\* cited by examiner

SUPER-REGENERATIVE RECEIVER (SRR) AND SUPER-REGENERATIVE RECEPTION METHOD WITH INCREASED CHANNEL SELECTIVITY

CROSS-REFERENCE TO RELATED APPLICATION

This application claims the benefit under 35 USC 119(a) of Korean Patent Application No. 10-2014-0007058, filed on Jan. 21, 2014, in the Korean Intellectual Property Office, the entire disclosure of which is incorporated herein by reference for all purposes.

BACKGROUND

1. Field

The following description relates to a super-regenerative receiver (SRR) and a super-regenerative reception method.

2. Description of Related Art

A super-regenerative receiver (SRR) may have a sufficient receiving sensitivity, and may be implemented readily at a low cost. The SRR may be applied to a wide range of fields, for example, remote control playthings, information systems, and monitoring devices.

The SRR may detect a signal based on a start-up time of an oscillator. The start-up time of the oscillator may be based on a frequency and an intensity of a signal received by an antenna. The oscillator may oscillate very slowly due to thermal noise based on a level of a direct current (DC) bias set in the oscillator although an input signal is not provided.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a super-regenerative receiver (SRR) including a super-regenerative oscillator (SRO), and an active channel filter disposed at a front end of the SRO, and configured to filter out an interferer in a signal received by the SRR.

The active channel filter may include an LC tank including a variable capacitor and an inductor.

The active channel filter may be configured to tune a resonant frequency of the active channel filter, using a variable capacitor.

The active channel filter may include a negative conductance cell configured to set a sharpness of the active channel filter to a value pre-stored in a lookup table through a calibration.

The negative conductance cell may be configured to adjust a current within a predetermined range to prevent oscillation of the negative conductance cell and to enable the sharpness to have the pre-stored value.

The SRR may further include a calibrator configured to control a resonant frequency of an LC tank included in the active channel filter to measure frequency sweep characteristics of the active channel filter.

The SRR may further include a spectrum analyzer configured to measure the frequency sweep characteristics, match the measured frequency sweep characteristics to a control code of the LC tank that corresponds to the resonant frequency, and store the matched frequency sweep characteristics.

The SRR may further include a calibrator configured to control a negative conductance of a negative conductance cell included in the active channel filter to measure sharpness characteristics of the active channel filter.

The SRR may further include a spectrum analyzer configured to measure the sharpness characteristics, match the measured sharpness characteristics to a control code of a bias current that corresponds to the negative conductance, and store the matched sharpness characteristics.

The SRR may further include a filter activator configured to activate the active channel filter in response to an interference level of the interferer being greater than a predetermined interference level.

In another general aspect, there is provided a super-regenerative reception method including filtering out an interferer in a signal received by a super-generative receiver, and super-regeneratively oscillating the filtered signal.

The filtering may include tuning a resonant frequency of an active channel filter, using a variable capacitor.

The filtering may include setting a sharpness of an active channel filter to a predetermined value, using a negative conductance cell.

The setting may include adjusting a current within a predetermined range to prevent oscillation of the negative conductance cell and to enable the sharpness to have the predetermined value.

The method may further include controlling a resonant frequency of an LC tank included in an active channel filter to measure frequency sweep characteristics of the active channel filter.

The method may further include measuring the frequency sweep characteristics, matching the frequency sweep characteristics to a control code of the LC tank that corresponds to the resonant frequency, and storing the matched frequency sweep characteristics.

The method may further include controlling a negative conductance of a negative conductance cell included in an active channel filter to measure sharpness characteristics of the active channel filter.

The method may further include measuring the sharpness characteristics, matching the sharpness characteristics to a control code of a bias current that corresponds to the negative conductance, and storing the matched sharpness characteristics.

The filtering may include activating an active channel filter in response to an interference level of the interferer being greater than a predetermined interference level.

A non-transitory computer-readable storage medium may store a program including instructions to cause a computer to perform the method.

Other features and aspects will be apparent from the following detailed description, the drawings, and the claims.

Figure 1:
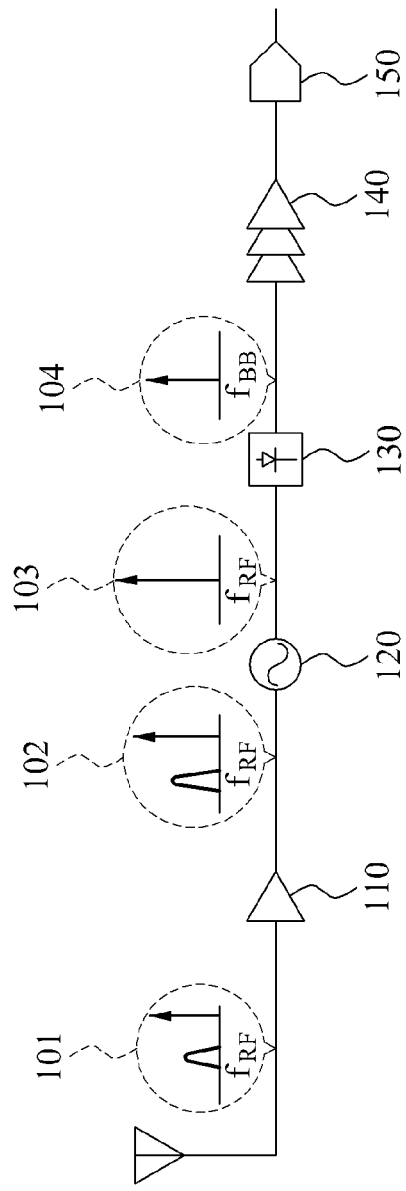
FIG. 1 is a diagram illustrating an example of a super-regenerative receiver (SRR).

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, a super-regenerative receiver (SRR) may refer to a receiver including a super-regenerative oscillator (SRO). Herein, an input signal may be referred to as a radio frequency (RF) signal or a received signal.

FIG. 1 is a diagram illustrating an example of an SRR 100. Referring to FIG. 1, in the SRR 100, a signal 101 input at an antenna immediately passes through a low noise amplifier (LNA) 110 or an isolator. An amplified input signal 102 passes through an SRO 120 configured to further amplify the amplified input signal 102, using a super-regenerative method. A further amplified input signal 103 passes through an envelope detector (ED) 130. That is, a form of an envelope of the input signal 103 passing through the ED 130 is transferred to a baseband at a baseband frequency $f_{BB}$. A signal 104 transferred to the baseband is input into an analog-to-digital converter (ADC) 150 through an amplifier 140.

As described above, the SRR 100 may obtain a gain with respect to the signal 102 input as a reception (RX) through the SRO 120. By obtaining the envelope of the amplified input signal 103, using the ED 130, a frequency band of the input signal 103 drops to the baseband. In such a configuration of the SRR 100, a block configured to implement a channel selectivity may be restricted to the SRO 120, and the LNA 110 or the isolator that is disposed at a front end of the SRO 120.

A channel selectivity of a filter may be proportional to a quality (Q) of a resonator. Herein, the term "Q" refers to a quality (Q) factor. In many configurations of a receiver (for example, configurations not including the SRO 120), a block configured to implement the channel selectivity may implement a filter at a frequency end that enables a relatively high Q of the resonator (for example, an intermediate frequency (IF) end or a baseband frequency end). Since all blocks configured to implement the channel selectivity correspond to RF blocks in the SRR 100, the Q of the resonator may be restricted, and the channel selectivity performance may be restricted.

For example, in the SRR 100, the SRO 120 may control an oscillation of a voltage controlled oscillator (VCO) through the input signal 101 input into the LNA 110, thereby receiving the input signal 101. The super-regenerative method employed by the SRR 100 may correspond to a method of detecting the input signal 101, using an LC resonator of the VCO. Thus, the channel selectivity of the SRR 100 may be proportional to frequency response characteristics of the VCO.

Frequency response characteristics of the SRR 100 may have a relatively low selectivity due to features of a relatively low Q of the LC resonator. Thus, when an input signal includes a desired RF signal, and does not include an interferer, a normal operation may be achieved. However, when an input signal including a strong interferer is input into an antenna, a reception performance may deteriorate.

When a strong interferer is included, the interferer may not be sufficiently eliminated before the input signal 101 reaches the VCO since the channel selectivity of the SRR 100 is relatively low. Thus, the VCO may not respond to the wanted RF signal, but respond to the strong interferer, and the signal 104 detected in the baseband may indicate a value obtained by responding to the interferer, rather than the input signal 101 input into the antenna.

Referring to FIG. 1, the input signal 101 received through the antenna may include a strong interferer. A wanted RF signal at a RF frequency $f_{RF}$ may be expressed using a sine waveform on a left side, and the interferer may be expressed using an impulse waveform on a right side. The input signal 101 received through the antenna may be amplified along with the strong interferer, and may be expressed as the signal 102 passing through the LNA 110. The signal 103 passing through the SRO 120 may still include the interferer. The signal 103 passing through the SRO 120 may pass through the ED 130, and may be expressed as the signal 104 detected in the baseband. For example, when the input signal 101 indicates "1010", the signal 104 converted to the baseband may indicate "1111" due to the strong interferer.

The SRR 100 may obtain a relatively high RF gain, and thus, may have an excellent receiving sensitivity and operate with a low power. However, since filtering to implement the channel selectivity may be performed at an RF frequency of a preceding end of the ED 130, the channel selectivity performance may be restricted.

Many applications of the SRR 100 may be used in an industrial, scientific and medical (ISM) band. Due to an insufficient channel selectivity, a received input signal may be deteriorated by an interferer component existing in an adjacent channel or a near-by frequency band.

Accordingly, the SRR 100 may be appropriate for low power connectivity communication within a few-meter distance since the SRR 100 may be structurally designed to operate with a low power. To increase the channel selectivity while maintaining the low-power characteristic, a quenching waveform (QW) may be transformed, or an external filter with a relatively high Q may be implemented. The external filter may include, for example, a film bulk acoustic resonator (FBAR). However, the external filter may be an off-chip having a size greater than a predetermined size. Thus, it may be difficult to use the external filter in an application having a restricted form factor.

In an example, it is possible to additionally implement a tunable multi-channel RF channel filter that is operable with a low power in the same integrated circuit (IC) process while maintaining the low power structure of the SRR 100. Through the implementation, the channel selectivity of the SRR 100 may increase. Hereinafter, the tunable multi-channel RF channel filter will be referred to as an active channel filter.

The active channel filter may be inserted at a front end of the SRO 120 in the SRR 100. In this example, the signal 102 input as an RX may pass through the active channel filter to be applied to the SRO 120. In this example, although an interferer of an adjacent channel is present in a channel where the input signal 102 exists, an effect of the interferer may be attenuated to be negligible before the input signal 102 is applied to the SRO 120.

Figure 2:
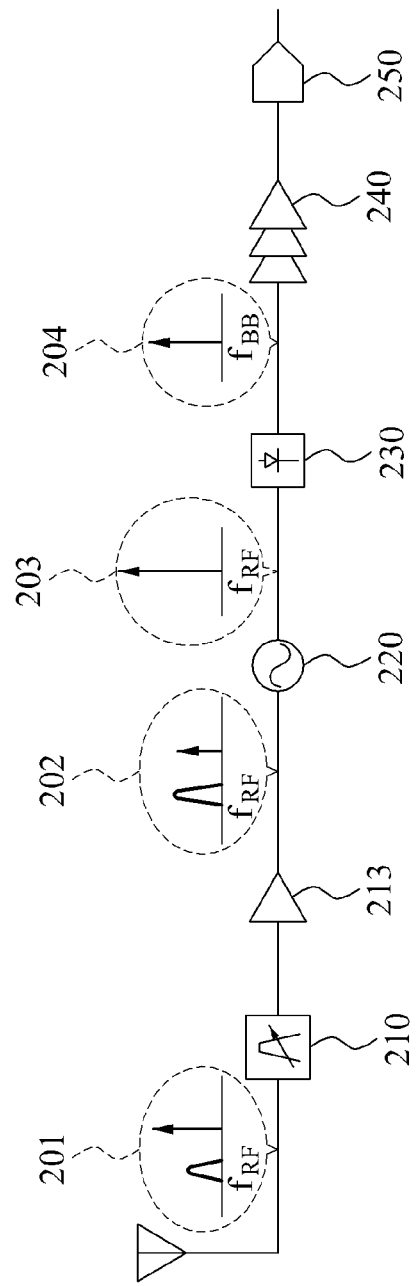
FIG. 2 is a diagram illustrating an example of an SRR including an active channel filter.

FIG. 2 is a diagram illustrating an example of an SRR 200 including an active channel filter 210. Referring to FIG. 2, the SRR 200 includes the active channel filter 210, an isolator 213, an SRO 220, an ED 230, an amplifier 240, and an ADC 250. The SRO 220, the ED 230, the amplifier 240, and the ADC 250 of FIG. 2 may be similar to the SRO 120, the ED 130, the amplifier 140, and the ADC 150, respectively, of FIG. 1.

The active channel filter 210 allows a wanted RF signal at a RF frequency $f_{RF}$ in an input signal 201 received through an antenna to pass through the active channel filter 210, and attenuates an unwanted interferer of an adjacent channel in the input signal 201, as shown in a signal 202. The active channel filter 210 is disposed at a front end of the SRO 220 to filter out an interferer.

The active channel filter 210 may include an LC tank including a variable capacitor and an inductor. The active channel filter 210 may tune a resonant frequency of the LC tank, using the variable capacitor.

The active channel filter 210 may include a negative conductance cell configured to set a sharpness of the active channel filter 210 to a predetermined value. The sharpness of the active channel filter 210 may correspond to, for example, a passband of the active channel filter 210. The negative conductance cell may adjust a current within a predetermined range to enable the negative conductance cell not to oscillate, and enable the sharpness to have the predetermined value.

The isolator 213 is an amplifier provided between the active channel filter 210 and the SRO 220. The isolator 213 isolates the active channel filter 210 from the SRO 220.

The SRO 220 is a VCO that provides high-gain characteristics with a low power in the SRR 200, i.e., amplifies the signal 202 to generate an amplified signal 203.

The ED 230 demodulates an envelope of the amplified signal 203 by detecting an envelope of the signal 203 that is amplified by the SRO 220, to generate an envelope-detected signal 204 at a baseband frequency $f_{BB}$.

The amplifier 240 is a variable gain amplifier (VGA) that adjusts a gain of the envelope-detected signal 204 to be suitable for an input range of the ADC 250.

The ADC 250 digitizes a signal passing through the amplifier 240, and transfers the digitized signal to a modem.

As illustrated in FIG. 2, the SRR 200 includes the active channel filter 210 disposed at the front end of the SRO 220. In this example, the input signal 201 received through the antenna passes through the active channel filter 210 designed to implement strong channel selectivity characteristics with respect to the interferer before the input signal 201 reaches the VCO, for example, the SRO 220. Thus, the wanted RF signal may have a dominant intensity in comparison to the interferer at the front end of the SRO 220. The SRO 220 responds to the wanted RF signal, and the signal 204 detected in a baseband may be the same as the input signal 201 received through the antenna.

The input signal 201 received through the antenna passes through the active channel filter 210, and is filtered to be the signal 202 in which the interferer is attenuated. The signal 202 is amplified to be the amplified signal 203 by the SRO 220. The amplified signal 203 passes through the ED 230 to be the signal 204 detected in the baseband. When the input signal 201 received through the antenna indicates "1010", the signal 204 detected in the baseband may also indicate "1010".

A channel selectivity corresponding to the active channel filter 210 may be added in the SRO 220. Thus, the channel selectivity characteristics of the SRR 200 may increase.

Figure 3:
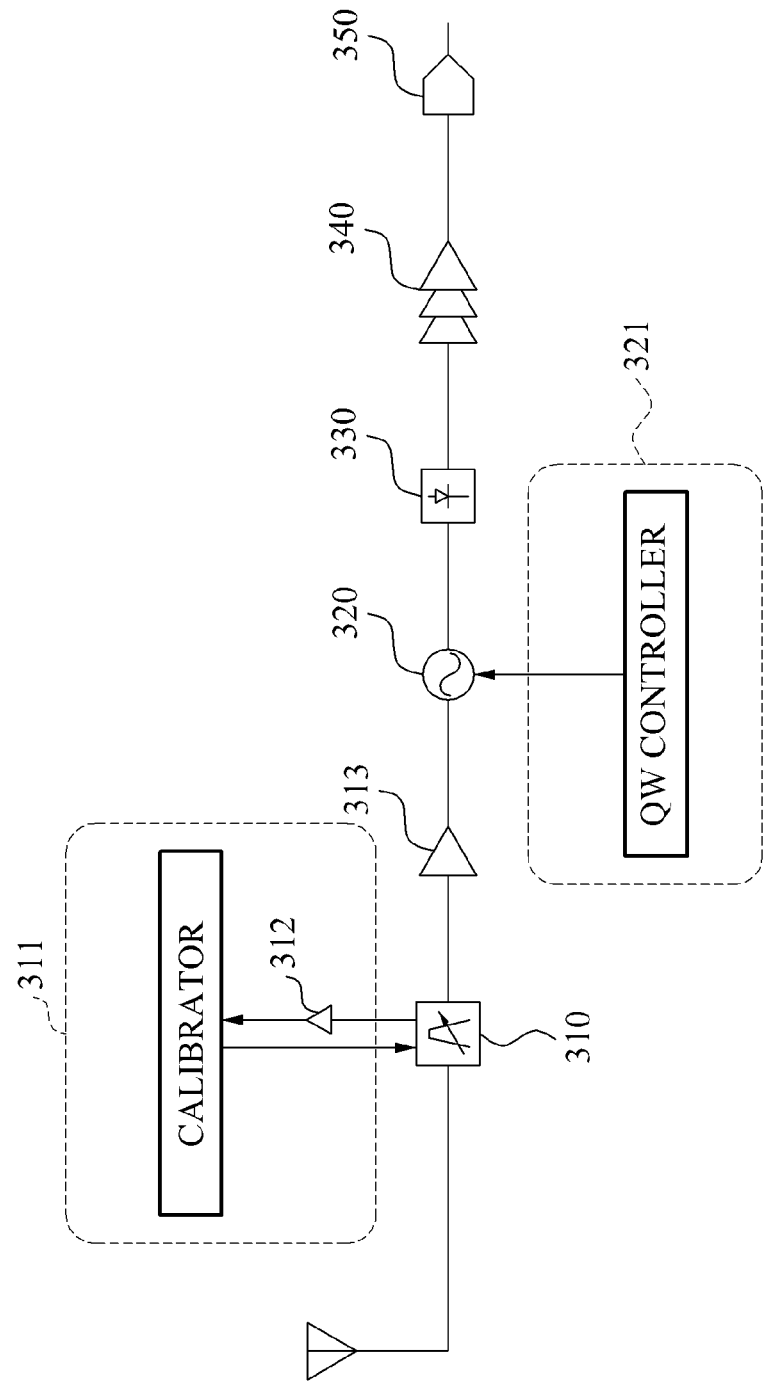
FIG. 3 is a diagram illustrating an example of an SRR with an increased channel selectivity.

FIG. 3 is a diagram illustrating an example of an SRR 300 with an increased channel selectivity. Referring to FIG. 3, the SRR 300 includes an active channel filter 310, an isolator 313, an SRO 320, an ED 330, an amplifier 340, and an ADC 350. The SRO 320, the ED 330, the amplifier 340, and the ADC 350 of FIG. 3 may be similar to the SRO 120, the ED 130, the amplifier 140, and the ADC 150, respectively, of FIG. 1. The SRR 300 further includes a calibrator 311 and a QW controller 321 as blocks configured to secure a channel selectivity thereof.

Although not shown in FIG. 3, the calibrator 311 may include a block configured to control a resonant frequency of the active channel filter 310, and a block configured to control a bias current in a negative conductance cell that is related to a gain and a sharpness of the active channel filter 310. The negative conductance cell may include, for example, a negative gm cell 812 of FIG. 8.

The active channel filter 310 may increase a Q of an LC tank. Thus, the Q of the LC tank may be controlled to be a suitable value. To control the Q of the LC tank, the active channel filter 310 includes a buffer amplifier 312 configured to detect an output of the active channel filter 310, and a bias control logic configured to control a negative gm and a gain of the active channel filter 310 including, for example, an LNA configured to increase a Q of a load. The active channel filter 310 may also include a control logic configured to tune the resonant frequency of the active channel filter 310.

The QW controller 321 controls a bias of the SRO 320. By controlling the bias of the SRO 320, a channel filtering effect may be secured. For example, the QW controller 321 may control QW generation to achieve the channel filtering effect at a predetermined frequency.

Figure 4:
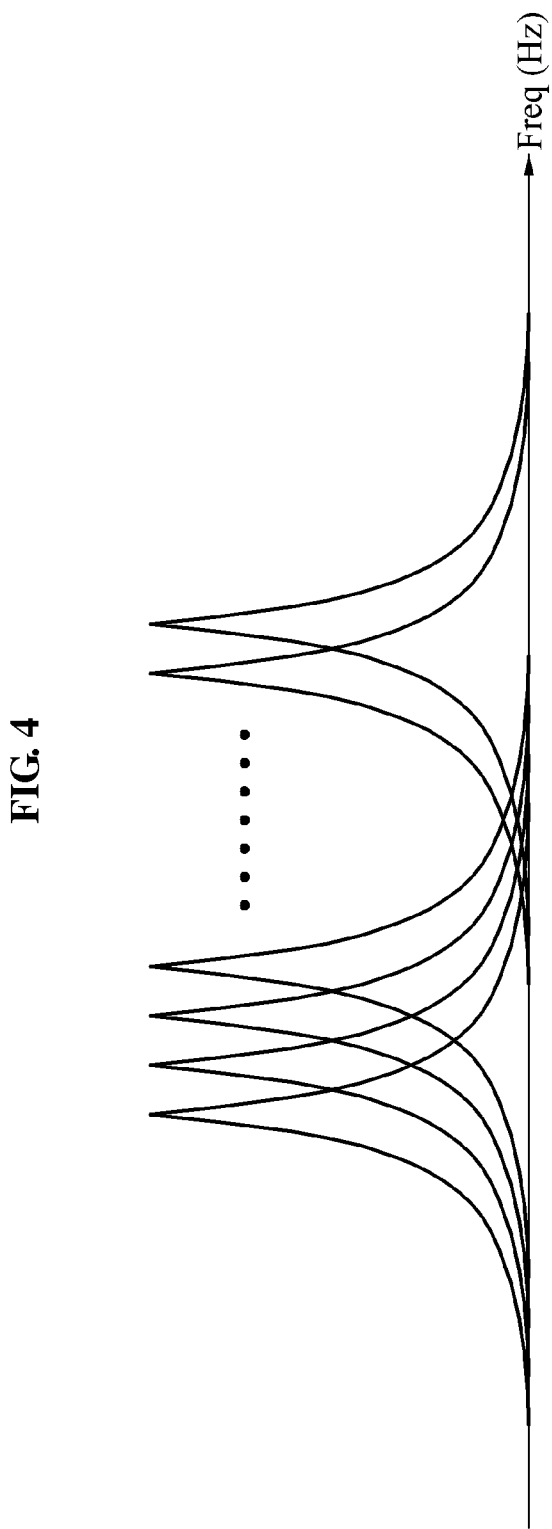
FIGS. 4 and 5 are diagrams illustrating examples of a sharpness and a resonant frequency that are tunable by an active channel filter.
Figure 5:
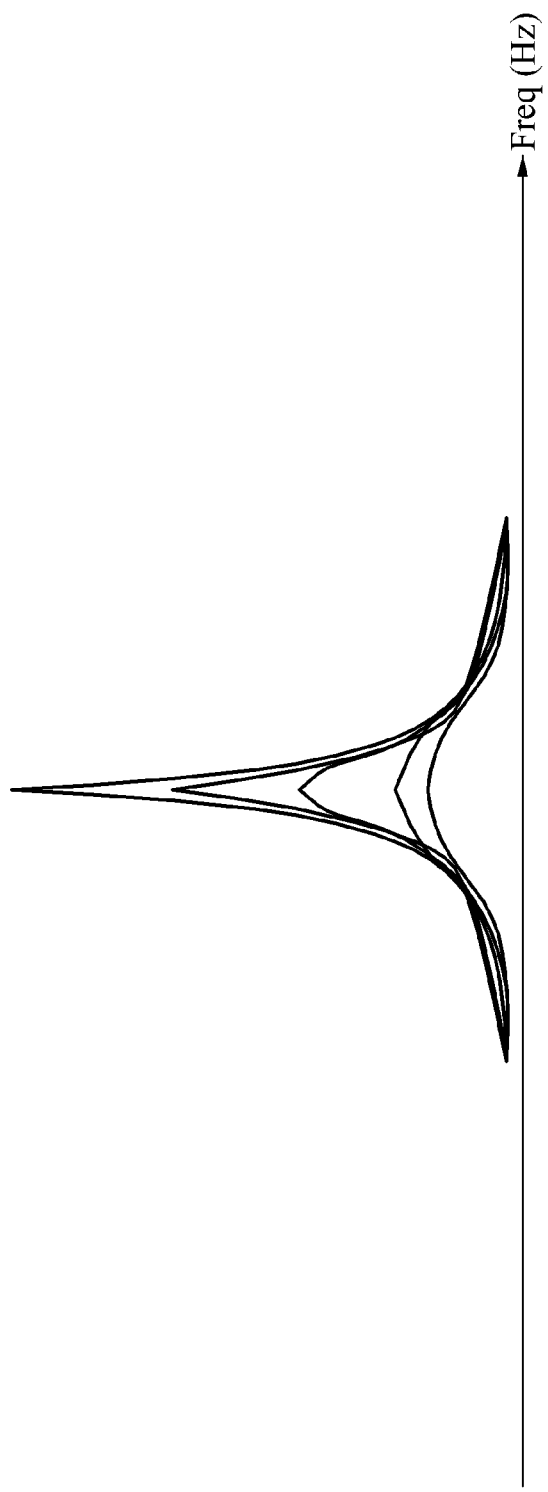

FIGS. 4 and 5 are diagrams illustrating examples of a sharpness and a resonant frequency that are tunable by an active channel filter. FIG. 4 illustrates an example of a resonant frequency tunable by an active channel filter. For example, the active channel filter may tune the resonant frequency, for example, a center frequency within a range from 2.3 gigahertz (GHz) to 2.6 GHz. The resonant frequency may be tuned using a variable capacitor of the active channel filter.

FIG. 5 illustrates an example of a sharpness tunable by an active channel filter. For example, the active channel filter may tune the sharpness of the active channel filter by adjusting a current of a negative conductance cell. By selecting a current value that satisfies a predetermined standard among sharpness characteristics as shown in FIG. 5 and that prevents an oscillation, a negative gm may be set. An SRR may operate while a sharpness of the active channel filter is being set to the set negative gm.

Figure 6:
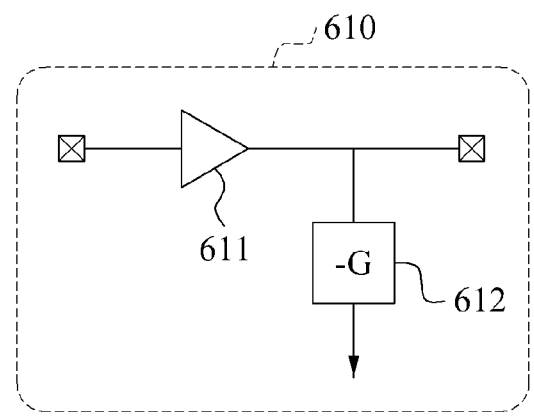
FIGS. 6 and 7 are diagrams illustrating examples of active channel filters, respectively.
Figure 7:
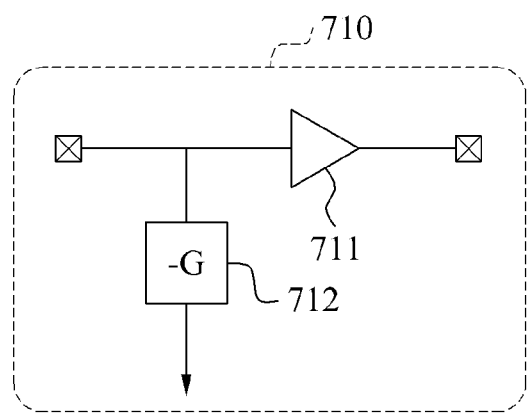

FIGS. 6 and 7 are diagrams illustrating examples of active channel filters 610 and 710, respectively. FIG. 6 illustrates the active channel filter 610 in which a negative conductance cell 612 is disposed at an output end of an LNA 611. FIG. 7 illustrates the active channel filter 710 in which a negative conductance cell 712 is disposed at an input end of an LNA 711. Configurations of the LNA 611 and the negative conductance cell 612 of FIG. 6 will be described in detail with reference to FIG. 8. Although FIG. 8 illustrates the configurations of FIG. 6, configurations of FIG. 7 may also be provided similar to FIG. 8.

Figure 8:
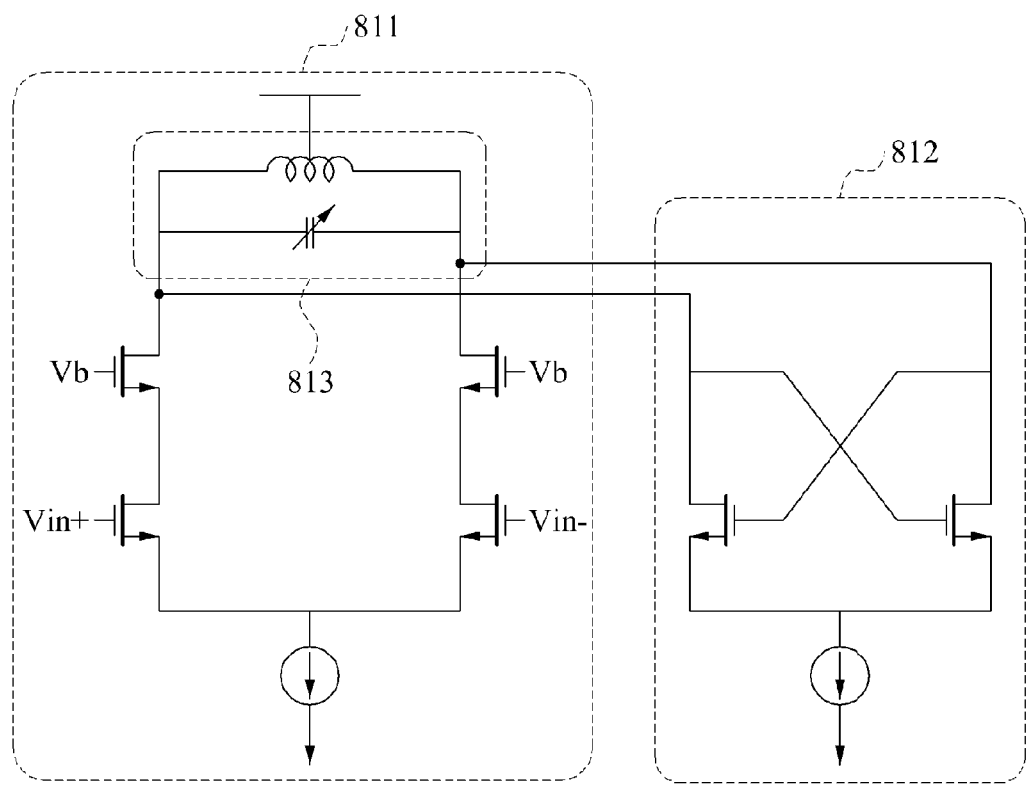
FIG. 8 is a diagram illustrating another example of an active channel filter.

FIG. 8 is a diagram illustrating another example of an active channel filter 810. Referring to FIG. 8, the active channel filter 810 includes an LNA 811 and a negative gm cell 812.

The LNA 811 includes an LC tank 813. The LC tank 813 includes a variable capacitor. In the LNA 811, Vb's indicate gate voltages, and Vin+ and Vin− denote input signal voltages.

The negative gm cell 812 may be disposed at an input end or an output end of the LNA 811. In the example of FIG. 8, the negative gm cell 812 is disposed at the output end of the LNA 811.

The negative gm cell 812 changes a negative gm by adjusting a bias current. Accordingly, a sharpness of the active channel filter 810 may be turned, as shown in FIG. 5. The bias current may be expressed as a direct current (DC) current bias. By implementing the bias current using a low resolution of about 1 microampere (μA), the negative gm cell 812 may be controlled exquisitely.

Figure 9:
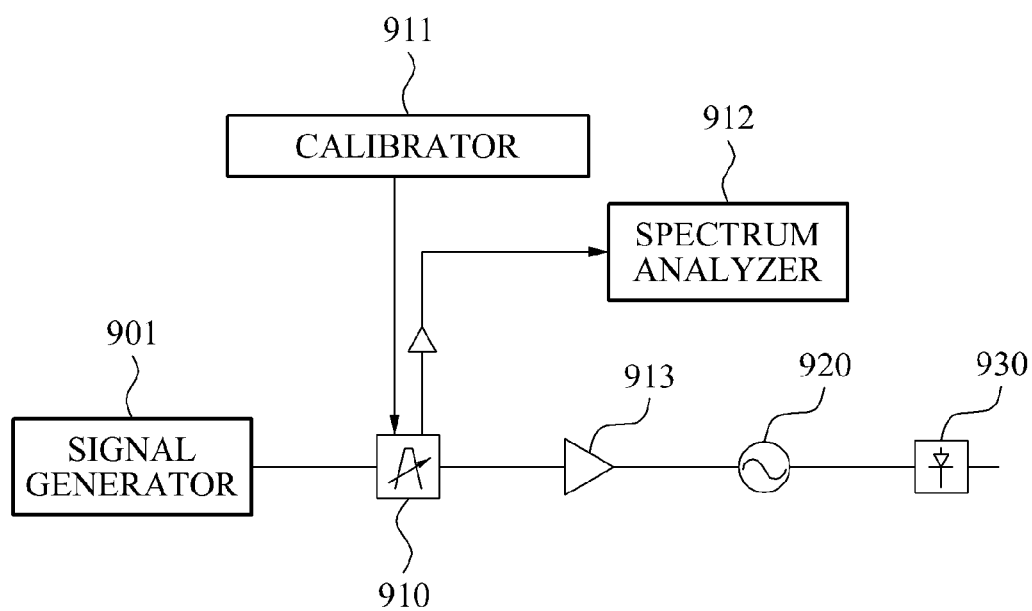
FIG. 9 is a diagram illustrating an example of an SRR configured to calibrate an active channel filter.

FIG. 9 is a diagram illustrating an example of an SRR 900 configured to calibrate an active channel filter 910. Referring to FIG. 9, the SRR 900 includes the active channel filter 910, an isolator 913, an SRO 920, and an ED 930, which may be similar to the active channel filter 210, the isolator 213, the SRO 220, and the ED 230, respectively, of FIG. 2. The SRR 900 further includes a signal generator 901, a calibrator 911, and a spectrum analyzer 912.

The calibrator 911 controls a resonant frequency of an LC tank included in the active channel filter 910. The resonant frequency of the LC tank may be associated with frequency sweep characteristics of the active channel filter 910. For example, the calibrator 911 may sweep the resonant frequency of the LC tank through a serial peripheral interface (SPI) control. The frequency sweep characteristics may include a resonant frequency with respect to a change in a variable capacitor of the LC tank.

The spectrum analyzer 912 measures the frequency sweep characteristics of the active channel filter 910. The spectrum analyzer 912 matches a center frequency of the active channel filter 910 that is measured by the spectrum analyzer 912 to a control code of the LC tank corresponding that corresponds to the center frequency, and stores the center frequency in a lookup table.

The calibrator 911 further controls a negative conductance of a negative conductance cell included in the active channel filter 910 to measure sharpness characteristics of the active channel filter 910. The calibrator 911 may control a bias current of the negative conductance cell through the SPI control.

The spectrum analyzer 912 further measures the sharpness characteristics of the active channel filter 910. The spectrum analyzer 912 further matches the sharpness characteristics measured by the spectrum analyzer 912 to a bias current control code of the negative conductance that corresponds to the sharpness characteristics, and stores the sharpness characteristics in the lookup table. The sharpness characteristics may include a gain that the active channel filter 910 obtains at a predetermined bias current in each frequency band.

The following Table 1 represents an example of storing frequency sweep characteristics, for example, a center frequency, by matching the center frequency of the active channel filter 910 to a control code of the LC tank, for example, a coarse Cbank code and a fine Cbank code, through a frequency calibration. When a capacitor of the LC tank includes a capacitor bank, the control code of the LC tank may indicate control of a 10-bit coarse capacitor and a 5-bit fine capacitor through on/off. For example, each bit of a control code may correspond to each capacitor of the LC tank. When a predetermined bit is "1", a capacitor corresponding to the predetermined bit may be controlled to be turned on. When the predetermined bit is "0", the capacitor corresponding to the predetermined bit may be controlled to be turned off. In detail, when the coarse Cband code in the following Table 1 corresponds to "10b00,0000,1000", a coarse capacitor corresponding to a fourth bit may be turned on, and all remaining capacitors may be turned off.

TABLE 1

| Coarse Cbank Code | FineCbank Code | Center Freq. |
|---|---|---|
| '10b00,0000,0000 | 'Sb0,0000 | 2,200 GHz |
| '10b00,0000,1000 | 'Sb0,0000 | 2,201 GHz |
| — | — | — |
| — | — | — |

The following Table 2 represents an example of storing sharpness characteristics, for example, a 5-MHz rejection and a 10-MHz rejection, by matching the sharpness characteristics to a control code, for example, an Ngm bias code, of a bias current corresponding to a conductance, through a sharpness calibration of the active channel filter 910. For example, a gain in each band may be stored for each control code of the bias current.

TABLE 2

| NGm BIAS Code | 5 MHz rejection | 10 MHz rejection |
|---|---|---|
| NGm BIAS Code | 5 MHz rejection | 10 MHz rejection |
| NGm BIAS Code | 5 MHz rejection | 10 MHz rejection |
| '10b00,1000,0000 | 3 dB | 5 dB |
| '10b00,1000,1000 | 10 dB | 20 dB |
| — | — | — |
| — | — | — |

The signal generator 901 generates a signal that may be used to calibrate the active channel filter 910 during a process of producing the SRR 900. The SRR 900 may preset the active channel filter 910 to respond to a wanted RF signal, in the producing process. However, it is not limited thereto. The SRR 900 may be calibrated based on an input signal received through an antenna.

Figure 10:
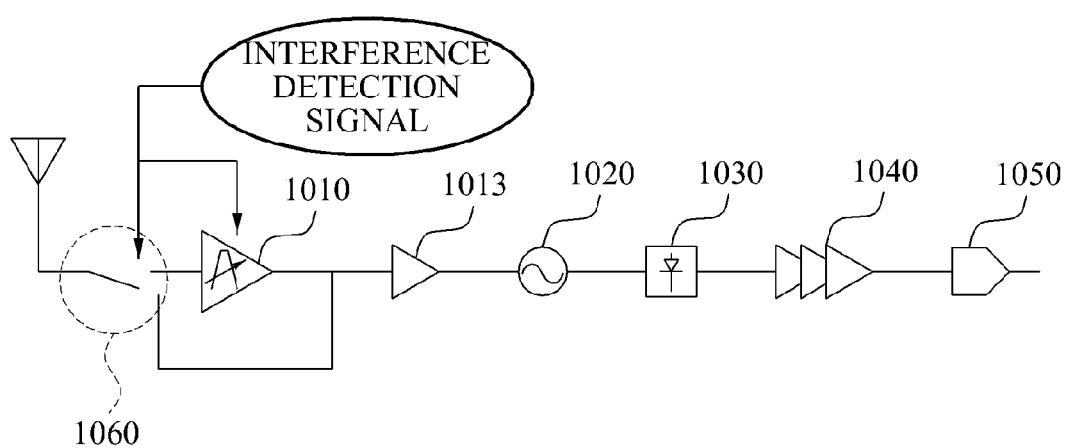
FIGS. 10 through 12 are diagrams illustrating examples of an SRR configured to activate an active channel filter by detecting an interferer.
Figure 11:
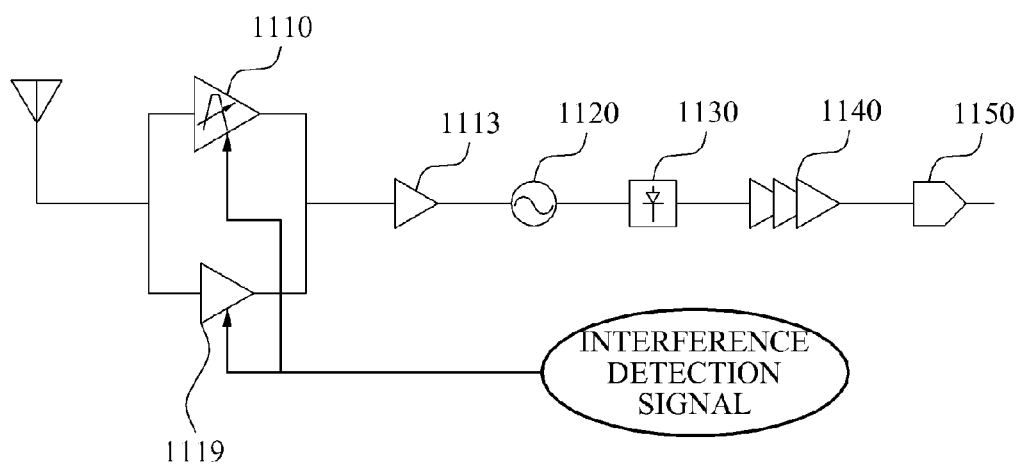
Figure 12:
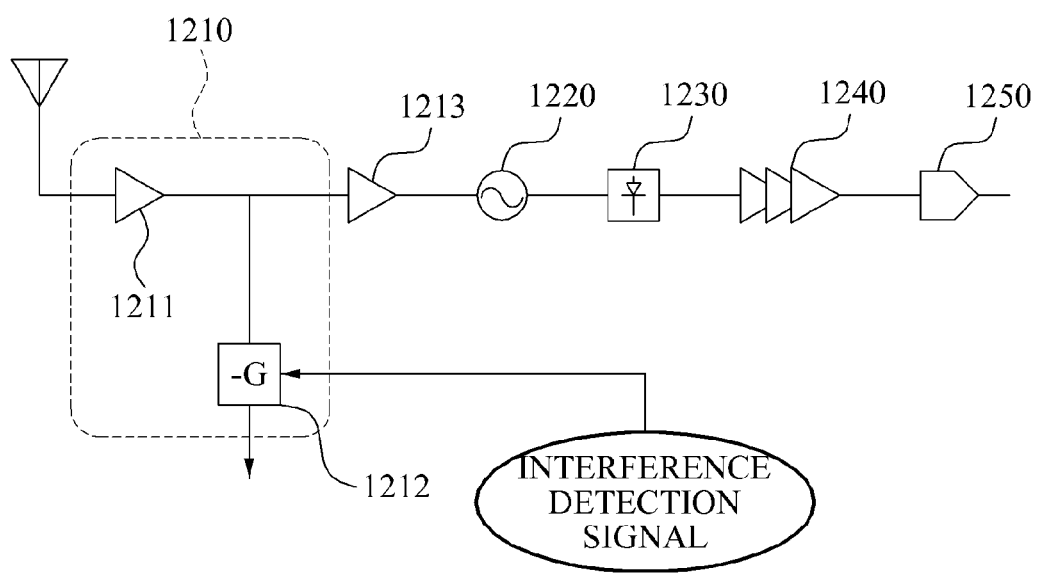

FIGS. 10 through 12 are diagrams illustrating examples of an SRR configured to activate an active channel filter by detecting an interferer. Active channel filters 1010, 1110, and 1210, isolators 1013, 1113, and 1213, SROs 1020, 1120, and 1220, EDs 1030, 1130, and 1230, amplifiers 1040, 1140, and 1240, and ADCs 1050, 1150, and 1250 of FIGS. 10 through 12 may be similar to the active channel filter 210, the isolator 213, the SRO 220, the ED 230, the amplifier 240, and the ADC 250, respectively, of FIG. 2.

A filter activator may activate an active channel filter when an interference level of an interferer is greater than a predetermined interference level. For example, the filter activator may activate the active channel filters 1010, 1110, and/or 1210 by generating an interference detection signal when the interference level of the interferer is greater than the predetermined interference level.

Referring to FIG. 10, when an interference detection signal is generated, the active channel filter 1010 is activated, and an antenna switch 1060 connects an antenna to an input end of the active channel filter 1010. A signal received through the antenna passes through the active channel filter 1010 to be transferred to the isolator 1013.

Referring to FIG. 11, when an interference detection signal is generated, the active channel filter 1110 is activated, and an LNA 1119 is deactivated. A signal received through an antenna passes through the active channel filter 1110 to be transferred to the isolator 1113. When an interference detection signal is not generated, the active channel filter 1110 is deactivated, and the LNA 1119 is activated. In this example, the signal received through the antenna passes through the LNA 1119 to be transferred to the isolator 1113.

Referring to FIG. 12, when an interference detection signal is generated, a negative conductance cell 1212 of the active channel filter 1210 is activated. When an interference detection signal is not generated, the negative conductance cell 1212 of the active channel filter 1210 is deactivated, and an input signal passes through an LNA 1211.

Figure 13:
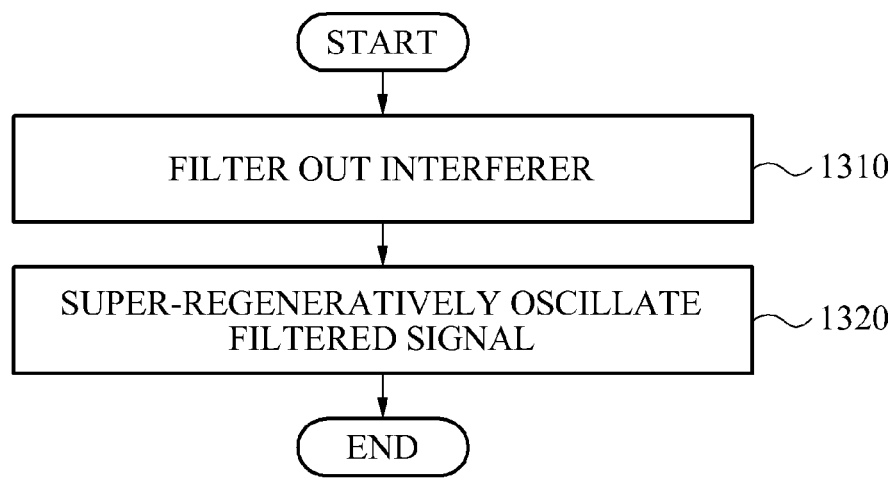
FIG. 13 is a flowchart illustrating an example of a super-regenerative reception method.

FIG. 13 is a flowchart illustrating an example of a super-regenerative reception method. Referring to FIG. 13, in operation 1310, an active channel filter filters out an interferer included in a signal received by an SRR. In an example, the active channel filter may tune a resonant frequency of the active channel filter, using a variable capacitor. In another example, the active channel filter may set a sharpness of the active channel filter to a predetermined value, using a negative conductance cell.

The active channel filter may set the sharpness to the predetermined value by adjusting a current within a predetermined range to prevent oscillation of the negative conductance cell and to enable the sharpness to have the predetermined value. The predetermined value may refer to a sharpness value corresponding to a level of bias current that prevents oscillation of the active channel filter not to oscillate and that enables the active channel filter to have a higher Q. For example, the bias current may be adjusted within the predetermined range. The predetermined range may be set to a range of current level within which the active channel filter does not oscillate. An example of controlling the resonant frequency of the active channel filter and the negative conductance will be described in detail with reference to FIGS. 14 and 15.

In operation 1320, an SRO super-regeneratively oscillates the filtered signal. The SRO may amplify an input signal by responding to a wanted RF signal in the signal in which the interferer is filtered out.

The SRR may include the active channel filter disposed at a front end of the SRO, as illustrated in FIG. 2. The active channel filter may tune the resonant frequency of the active channel filter. The resonant frequency may be a center frequency of a bandpass characteristic of the active channel filter. The active channel filter may tune the sharpness of the active channel filter. The active channel filter may include the negative conductance cell and an LNA.

Figure 14:
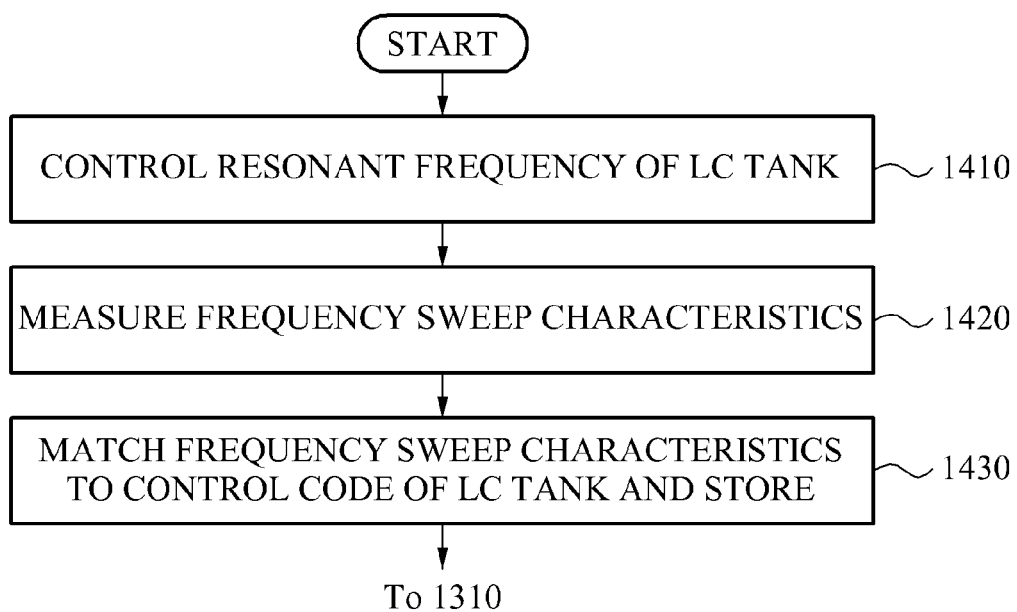
FIGS. 14 and 15 are flowcharts illustrating examples of methods of establishing a lookup table to tune a sharpness and a resonant frequency, respectively, in an active channel filter.
Figure 15:
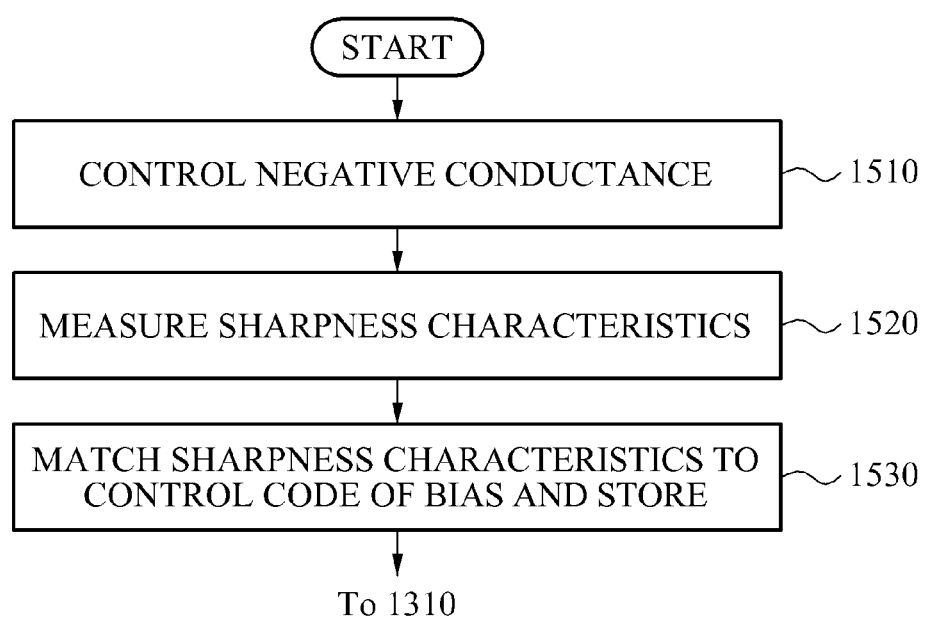

The active channel filter may calibrate the resonant frequency and the sharpness, using methods of FIGS. 14 and 15. By calibrating the sharpness, a Q of the SRR may increase.

FIGS. 14 and 15 are flowcharts illustrating examples of methods of establishing a lookup table to tune a sharpness and a resonant frequency, respectively, in an active channel filter. FIG. 14 illustrates an example of a method of establishing a lookup table to tune a resonant frequency in an active channel filter. Referring to FIG. 14, in operation 1410, a calibrator controls a resonant frequency of an LC tank. The calibrator controls the resonant frequency of the LC tank included in the active channel filter to measure frequency sweep characteristics of the active channel filter.

In operation 1420, a spectrum analyzer measures the frequency sweep characteristics.

In operation 1430, the spectrum analyzer matches the frequency sweep characteristics measured by the spectrum analyzer to a control code of the LC tank, and stores the frequency sweep characteristics. The control code of the LC tank may correspond to the resonant frequency. The frequency sweep characteristics may be stored as shown in Table 1. The method continues in operation 1310 of FIG. 13.

FIG. 15 illustrates an example of a method of establishing a lookup table to tune a sharpness in an active channel filter. Referring to FIG. 15, in operation 1510, a calibrator controls a negative conductance. The calibrator controls the negative conductance of a negative conductance cell included in the active channel filter to measure sharpness characteristics of the active channel filter.

In operation 1520, a spectrum analyzer measures the sharpness characteristics.

In operation 1530, the spectrum analyzer matches the sharpness characteristics measured by the spectrum analyzer to a control code of a bias, and stores the sharpness characteristics. The bias may refer to a bias current corresponding to the negative conductance. The sharpness characteristics may be stored as shown in Table 2. The method continues in operation 1310 of FIG. 13.

In an example, a channel selectivity of an SRR may increase. Thus, an adjacent signal interference phenomenon of the SRR may be alleviated.

An active channel filter of the SRR may have LNA characteristics of a tunable high load. Thus, although the active channel filter is added to the SRR, noise characteristics of the SRR may not deteriorate. Since the deterioration in the noise characteristics may be prevented, the SRR may secure stable low noise, low power characteristics, and a relatively high selectivity.

The SRR may be utilized for a sensor network that operates within a few-meter distance due to the low power characteristics. In addition, the SRR may perform reliable communication in an open space where a number of interferers exist.

The active channel filter included in the SRR may increase a Q of the LNA by utilizing a structure of a negative conductance cell. Thus, such a structure of the SRR may be easily implemented within a typical IC process. Since the active channel filter included in the SRR may use a relatively small amount of power, the active channel filter may be suitable for low-power applications.

Even in an IC process in which a Q of an implementable LC tank is restricted to about 20, an SRR with a relatively high channel selectivity may be implemented by disposing an active channel filter at a front end of an SRO. The channel selectivity of the active channel filter may be proportional to the Q of the LC tank.

The SRR including the active channel filter may be implemented using a one-chip solution through the same complementary metal-oxide semiconductor (CMOS) process. However, a structure in which a high-Q device, for example, an FBAR, is utilized may structurally use a number of FBAR filters corresponding to a number of channels, rather than the one-chip solution, and thus, an implementation thereof may be relatively complex.

The SRR including the active channel filter may be applicable to a low-power/ultra-power transceiver, a wake-up receiver combined with a connectivity solution, and a medical implant communication service (MICS). The wake-up receiver combined with the connectivity solution may include, for example, a wireless local area network (WLAN) receiver, a Bluetooth receiver, and/or a Zigbee receiver.

The various blocks, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A super-regenerative receiver (SRR) comprising:
a super-regenerative oscillator (SRO); and
an active channel filter disposed at a front end of the SRO, and configured to filter out an interferer in a signal received by the SRR,
wherein the active channel filter comprises:
a negative conductance cell configured to set a sharpness of the active channel filter to a value stored in a lookup table through a calibration.

2. The SRR of claim 1, wherein the active channel filter comprises:
an LC tank comprising a variable capacitor and an inductor.

3. The SRR of claim 1, wherein the active channel filter is configured to tune a resonant frequency of the active channel filter, using a variable capacitor.

4. The SRR of claim 1, wherein the negative conductance cell is configured to adjust a current within a range to prevent oscillation of the negative conductance cell and to enable the sharpness to have the stored value.

5. The SRR of claim 1, further comprising:
a calibrator configured to control a resonant frequency of an LC tank included in the active channel filter to measure frequency sweep characteristics of the active channel filter.

6. The SRR of claim 5, further comprising:
a spectrum analyzer configured to
measure the frequency sweep characteristics,
match the measured frequency sweep characteristics to a control code of the LC tank that corresponds to the resonant frequency, and
store the matched frequency sweep characteristics.

7. The SRR of claim 1, further comprising:
a calibrator configured to control the negative conductance of a negative conductance cell included in the active channel filter to measure sharpness characteristics of the active channel filter.

8. The SRR of claim 7, further comprising:
a spectrum analyzer configured to
measure the sharpness characteristics,
match the measured sharpness characteristics to a control code of a bias current that corresponds to the negative conductance, and
store the matched sharpness characteristics.

9. The SRR of claim 1, further comprising:
a filter activator configured to activate the active channel filter in response to an interference level of the interferer being greater than a predetermined interference level.

10. A super-regenerative reception method comprising:
filtering out an interferer in a signal received by a super-generative receiver; and
super-regeneratively oscillating the filtered signal,
wherein the filtering comprises setting a sharpness of an active channel filter to a value stored in a lookup table through a calibration, using a negative conductance cell.

11. The method of claim 10, wherein the filtering comprises tuning a resonant frequency of the active channel filter, using a variable capacitor.

12. The method of claim 10, wherein the setting comprises adjusting a current within a range to prevent oscillation of the negative conductance cell and to enable the sharpness to have the stored value.

13. The method of claim 10, further comprising:
controlling a resonant frequency of an LC tank included in the active channel filter to measure frequency sweep characteristics of the active channel filter.

14. The method of claim 13, further comprising:
measuring the frequency sweep characteristics;
matching the frequency sweep characteristics to a control code of the LC tank that corresponds to the resonant frequency; and
storing the matched frequency sweep characteristics.

15. The method of claim 10, further comprising:
controlling a negative conductance of the negative conductance cell included in the active channel filter to measure sharpness characteristics of the active channel filter.

16. The method of claim 15, further comprising:
measuring the sharpness characteristics;
matching the sharpness characteristics to a control code of a bias current that corresponds to the negative conductance; and
storing the matched sharpness characteristics.

17. The method of claim 10, wherein the filtering comprises activating the active channel filter in response to an interference level of the interferer being greater than a predetermined interference level.

18. A non-transitory computer-readable storage medium storing a program comprising instructions to cause a computer to perform the method of claim 10.

* * * * *